United States Patent
Uejima

(10) Patent No.: US 9,892,788 B2
(45) Date of Patent: Feb. 13, 2018

(54) MEMORY DEVICE INCLUDING RESISTANCE RANDOM ACCESS MEMORY, AND STORING METHOD THAT STORES DATA IN THE RESISTANCE RANDOM ACCESS MEMORY

(71) Applicant: Renesas Electronics Corporation, Tokyo (JP)

(72) Inventor: Kazuya Uejima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/224,524

(22) Filed: Jul. 30, 2016

(65) Prior Publication Data

US 2017/0076781 A1    Mar. 16, 2017

(30) Foreign Application Priority Data

Sep. 16, 2015  (JP) ................. 2015-182707

(51) Int. Cl.
| | |
|---|---|
| G11C 5/14 | (2006.01) |
| G11C 14/00 | (2006.01) |
| G11C 13/00 | (2006.01) |
| G11C 7/10 | (2006.01) |
| G11C 7/20 | (2006.01) |
| G11C 7/24 | (2006.01) |

(52) U.S. Cl.
CPC .......... *G11C 14/009* (2013.01); *G11C 7/1006* (2013.01); *G11C 7/20* (2013.01); *G11C 7/24* (2013.01); *G11C 13/004* (2013.01); *G11C 13/0033* (2013.01); *G11C 13/0069* (2013.01); *G11C 13/0097* (2013.01); *G11C 14/0045* (2013.01)

(58) Field of Classification Search
CPC ........... G11C 7/1006; G11C 7/20; G11C 7/24; G11C 13/0033; G11C 13/004; G11C 13/0069; G11C 13/0097; G11C 14/0045
USPC ......................................... 365/148
See application file for complete search history.

(56) References Cited

U.S. PATENT DOCUMENTS

| | | | | |
|---|---|---|---|---|
| 8,369,173 | B2* | 2/2013 | Kim ................ | G11C 5/147 365/194 |
| 9,299,428 | B2* | 3/2016 | Kim ................ | G11C 13/0035 |
| 2010/0214862 | A1* | 8/2010 | Kim ................ | G11C 5/147 365/226 |
| 2015/0228336 | A1* | 8/2015 | Kim ................ | G11C 13/0035 365/163 |

FOREIGN PATENT DOCUMENTS

| | | |
|---|---|---|
| JP | 2006-059228 A | 3/2006 |
| JP | 2007-109148 A | 4/2007 |

* cited by examiner

*Primary Examiner* — Pho M Luu
*Assistant Examiner* — Xiaochun L Chen
(74) *Attorney, Agent, or Firm* — McGinn I.P. Law Group, PLLC.

(57) ABSTRACT

It is required to store data to be stored for a holding period required for this data and then erase the data while suppressing power consumption. A memory device 10 to solve such a problem has the following configuration. The memory device 10 includes an ReRAM (resistance random access memory) 100 and a storage controller 101. The storage controller 101 performs control to store, in a storing condition according to a holding period required for data to be stored, the data in the ReRAM 100.

18 Claims, 19 Drawing Sheets

MEMORY DEVICE INCLUDING RESISTANCE RANDOM ACCESS MEMORY, AND STORING METHOD THAT STORES DATA IN THE RESISTANCE RANDOM ACCESS MEMORY

CROSS-REFERENCE TO RELATED APPLICATIONS

This application is based upon and claims the benefit of priority from Japanese patent application No. 2015-182707, filed on Sep. 16, 2015, the disclosure of which is incorporated herein in its entirety by reference.

BACKGROUND

The present invention relates to a memory device and a storing method and relates to, for example, a memory device and a storing method that store data that is required to be stored for a finite period of time.

When security information such as key information or authentication information is stored in a memory device, time during which the memory device holds the security information may be preferably finite for security or operational reasons. It is therefore required to provide a memory device capable of erasing stored information after an elapse of a finite period of time.

Japanese Unexamined Patent Application Publication No. 2007-109148 or Japanese Unexamined Patent Application Publication No. 2006-059228 is one example of the above technique. Japanese Unexamined Patent Application Publication No. 2007-109148 discloses an external memory device that stops a refresh operation of a DRAM and erases stored data when time of a timer has reached a predetermined time. Japanese Unexamined Patent Application Publication No. 2006-059228 further discloses a memory device that interrupts power supply to a volatile memory when a specific phenomenon has occurred.

SUMMARY

In the technique disclosed in Japanese Unexamined Patent Application Publication No. 2007-109148, a refresh power is required to keep the storage. In the technique disclosed in Japanese Unexamined Patent Application Publication No. 2006-059228 as well, it is required to continuously supply power to the volatile memory in order to keep the storage.

It is therefore required to store the data to be stored for a holding period required for the data and then erase the data while suppressing power consumption.

The other problems of the related art and the novel characteristics of the present invention will be made apparent from the descriptions of the specification and the accompanying drawings.

According to an embodiment, a memory device causes data to be stored in a resistance random access memory in a storing condition according to a holding period required for this data.

According to the embodiment, it is possible to store the data to be stored for the holding period required for the data and then erase the data while suppressing the power consumption.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
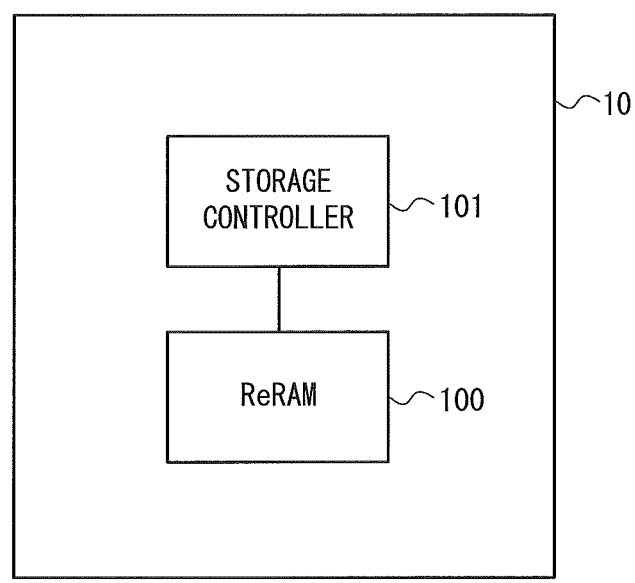
FIG. 1 is a block diagram for describing an outline of a memory device according to a first embodiment.

For the clarification of the description, the following description and the drawings may be omitted or simplified as appropriate. Further, each element shown in the drawings as functional blocks that perform various processing can be formed of a CPU, a memory, and other circuits in hardware and may be implemented by programs loaded in the memory in software. Those skilled in the art will therefore understand that these functional blocks may be implemented in various ways by only hardware, only software, or the combination thereof without any limitation. Throughout the drawings, the same components are denoted by the same reference symbols and overlapping descriptions will be omitted as appropriate.

The program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (compact disc read only memory), CD-R (compact disc recordable), CD-R/W (compact disc rewritable), and semiconductor memories (such as mask ROM, PROM (programmable ROM), EPROM (erasable PROM), flash ROM, RAM (random access memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

<First Embodiment>

Before describing details of a first embodiment, an outline of the first embodiment will be described first. FIG. 1 is a block diagram for describing the outline of a memory device 10 according to the first embodiment. As shown in FIG. 1, the memory device 10 includes a resistance random access memory (ReRAM) 100 and a storage controller 101. The memory device 10 is constituted, for example, as a microcomputer.

The ReRAM 100 is also called a resistance random access memory and stores information due to a change in electrical resistances. The storage controller 101 performs control to store data to be stored in the ReRAM 100 in a storing condition according to a holding period required for this data. The memory device 10 therefore stores data for a finite period of time according to the holding period required for the data. That is, while an information holding period in the ReRAM 100 is generally about 10 years, the information holding period in the ReRAM 100 in the memory device 10 according to this embodiment may be set to a period shorter than 10 years according to the control by the storage controller 101.

Since the memory device 10 uses the ReRAM. 100, it is possible to suppress power consumption when data is stored. The memory device 10 may be included in, for example, an integrated circuit (IC) card and may store security information such as key information or authentication information. The memory device 10 is included in, for example, a theme park ticket, a Subscriber Identity Module (SIM) card for tourists, a credit card or the like and stores key information used for authentication in the ReRAM 100. When the memory device 10 is used as the theme park ticket, for example, the period during which the key information is held is set to one day. When it is used as the SIM card for tourists, the period during which the key information is held is set to one week. When it is used as the credit card, the period during which the key information is held is set to five years. By adjusting the period during which the key information is held in the ReRAM 100 by the storage controller 101, when the holding period required for the data elapses, the key information can be erased and the key information cannot be used thereafter.

Figure 2:
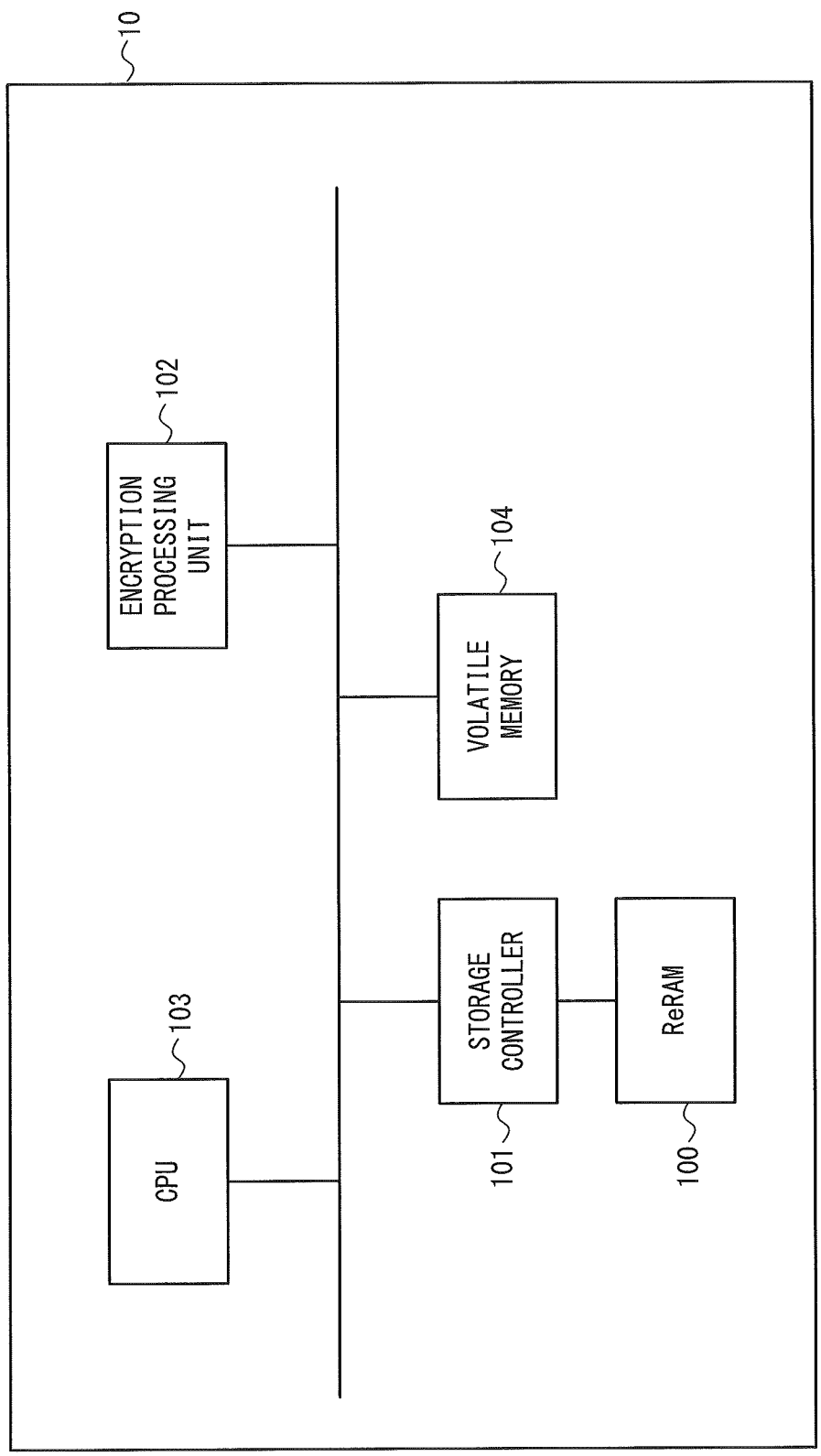
FIG. 2 is a block diagram showing a configuration of the memory device according to the first embodiment.

Hereinafter, the details of the first embodiment will be described. FIG. 2 is a block diagram showing a configuration of the memory device 10 according to the first embodiment. As shown in FIG. 2, the memory device 10 includes the ReRAM 100, the storage controller 101, an encryption processing unit 102, a Central Processing Unit (CPU) 103, and a volatile memory 104.

Figure 3:
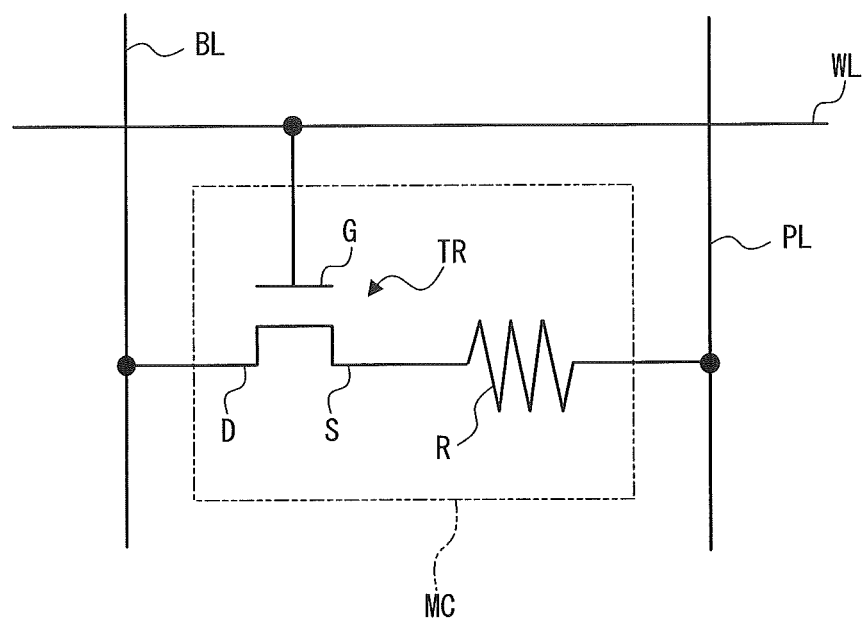
FIG. 3 is a circuit diagram showing an equivalent circuit of an ReRAM.

As described above, the ReRAM 100 is a resistance random access memory that stores information according to the change in electrical resistances and specifically includes, for example, a memory cell MC as shown in FIG. 3. While only one memory cell MC is shown in FIG. 3, the ReRAM 100 includes a plurality of memory cells MC arranged in array, for example, and each of the memory cells stores one-bit information. The memory cell MC includes a variable resistance element R and a transistor TR.

A variable resistance layer (not shown) is provided between electrodes on the respective ends of the variable resistance element R. By applying a designated voltage signal and flowing a current, the resistance value of the variable resistance layer can be changed. Accordingly, data can be rewritten in the memory cell MC.

The variable resistance element R has one electrode that is electrically connected to a plate line PL and the other electrode that is connected to a source electrode S of the transistor TR. Further, a drain electrode D of the transistor TR is connected to a bit line BL and a gate electrode thereof is connected to a word line WL. According to such a configuration, when data is written into the memory cell MC, for example, a specified voltage signal is applied to the variable resistance element R to write one-bit information. On the other hand, when the data is read out from the memory cell MC, the resistance value of the variable resistance element R is determined by a threshold, whereby the information stored in the memory cell MC is read out. That is, the ReRAM 100 stores one-bit information depending on whether the resistance value of the variable resistance element R is in a high-resistance state or in a low-resistance state with respect to the threshold.

The storage controller 101 controls the storage of the ReRAM 100 by controlling the voltage of the word line WL, the voltage of the bit line BL, and the voltage of the plate line PL. As described above, the storage controller 101 performs control to store the data in the ReRAM 100 in the storing condition according to the holding period required for the data to be stored. In this embodiment, specifically, the storage controller 101 performs control to write the information in the memory cell MC in the write energy according to the holding period required for the data to be stored. The write energy is an energy that depends on at least the magnitude of a current when data is written into the ReRAM 100. Specifically, the write energy is obtained by multiplying the voltage that has been applied, the amount of current that has flowed, and time during which the voltage signal has been applied. Therefore, in this embodiment, the aforementioned storing condition specifies at least the magnitude of the current when the data is written in the ReRAM 100. The storage controller 101 therefore writes data at a current having the magnitude according to the holding period.

Figure 4:
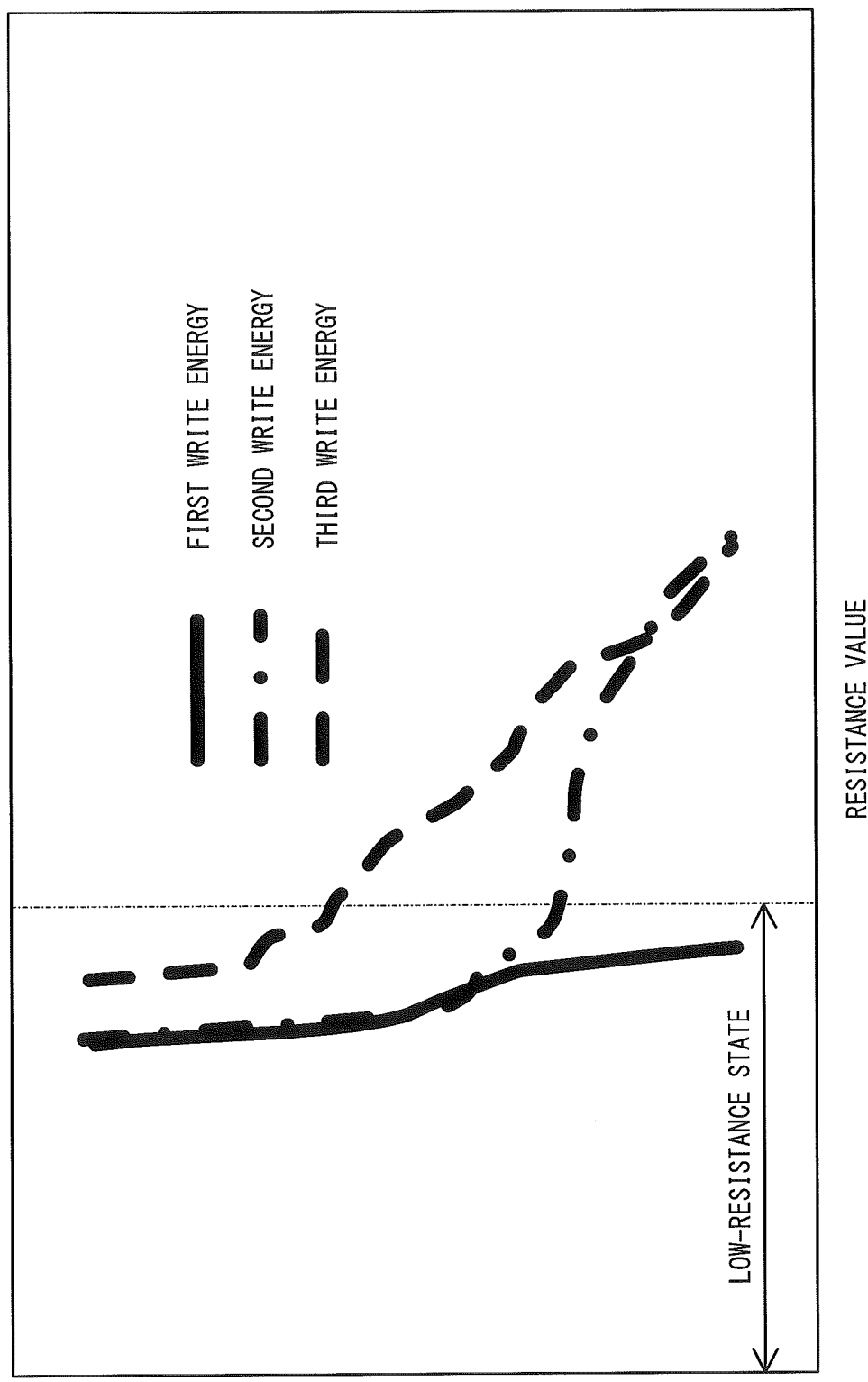
FIG. 4 is a distribution diagram showing a distribution of resistance values of a variable resistance element R one hour after it has been set to a low-resistance state at a predetermined write energy.

Now, a relation between the write energy and the data holding period will be described. The present inventors have found that the period during which the low-resistance state is maintained varies depending on the write energy when the data is written when the state of the variable resistance element R is the low-resistance state by the write operation. The low-resistance state here means a state in which the variable resistance element R has a resistance value lower than the predetermined threshold. FIG. 4 is a distribution diagram showing a distribution of resistance values of the variable resistance element R one hour after it has been set to the low-resistance state at a predetermined write energy. In FIG. 4, the vertical axis indicates each variable resistance element R. In the vertical axis, each variable resistance element R is sorted in the order of the magnitude of the resistance value one hour later. The horizontal axis indicates the resistance value of the variable resistance element R one hour later. While FIG. 4 shows the distribution of the resistance values one hour after the writing has been performed, all the variable resistance elements R are set to the low-resistance state at the timing when the data is written. While the resistance values of the variable resistance elements R tend to increase with time, the increasing speed varies depending on the write energy.

In the example shown in FIG. 4, the distribution of the group of the variable resistance elements R into which data has been written at a first write energy (distribution shown by a solid line), the distribution of the group of the variable resistance elements R into which data has been written at a second write energy (distribution shown by an alternate long and short dash line), and the distribution of the group of the variable resistance elements R into which data has been written at a third write energy (distribution shown by a dashed line) are shown. The distribution of the writing by the first write energy shows the distribution of a case in which the write operation is performed by allowing the current having a first current value to flow through each variable resistance element R. Further, the distribution of the writing by the second write energy shows the distribution of a case in which the write operation is performed by allowing the current having a second current value, which is smaller than the first current value, to flow through each variable resistance element R. Further, the distribution of the writing by the third write energy shows the distribution of a case in which the writing operation is performed by allowing the current having a third current value, which is smaller than the second current value, to flow through each variable resistance element R.

In the example shown in FIG. 4, all the variable resistance elements R into which the data has been written at the first write energy maintain the low-resistance state even one hour after the writing is performed. On the other hand, some of the variable resistance elements R into which the data has been written at the second write energy and some of the variable resistance elements R into which the data has been written at the third write energy cannot maintain the low-resistance state one hour after the writing is performed. In particular, the group of the variable resistance elements R in which the data has been written at the third write energy, which is the smallest among the three conditions, includes the largest number of variable resistance elements R that cannot maintain the low-resistance state. That the variable resistance element R cannot maintain the low-resistance state means that it is impossible to maintain the storage of 0 or 1, which is a one-bit value corresponding to the low-resistance state. That is, that the variable resistance element R cannot maintain the low-resistance state means that the data that has been stored is destroyed.

Figure 5:
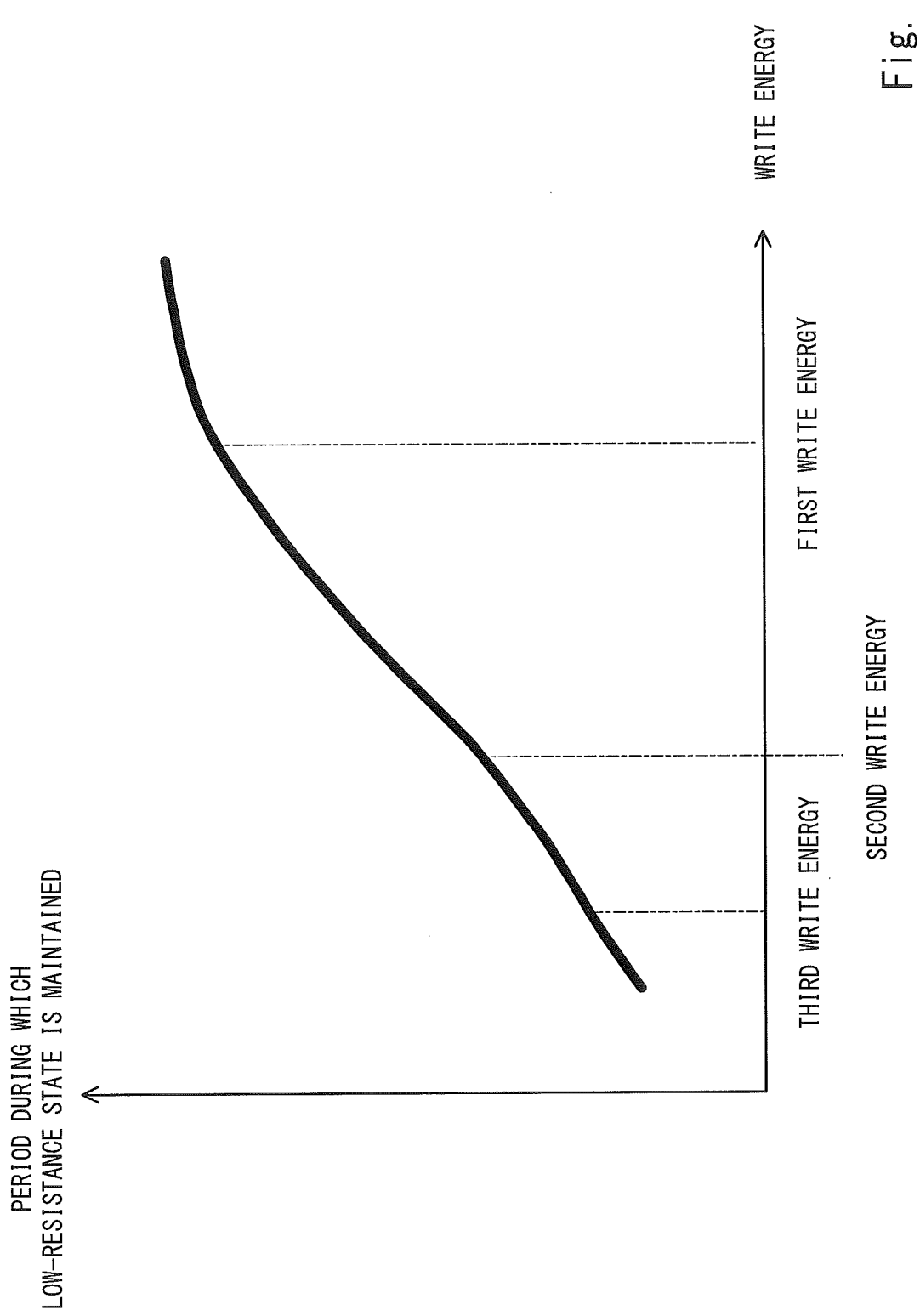
FIG. 5 is a graph showing a relation between a write energy and a period during which the low-resistance state is maintained.

FIG. 5 is a graph showing a relation between the write energy and the period during which the low-resistance state is maintained. In FIG. 5, the horizontal axis indicates the magnitude of the write energy when the data is written and the vertical axis indicates the length of the period during which the variable resistance element R keeps the low-resistance state. As shown in FIG. 4, when data is written at an arbitrary write energy, the performance varies due to the individual difference among the variable resistance elements. Therefore, the graph in FIG. 5 particularly shows the variable resistance elements whose performance level reaches a predetermined level among the population of the variable resistance elements.

As shown in FIG. 5, the length of the period during which the low-resistance state is maintained varies depending on the magnitude of the write energy when the data is written.

Specifically, as the write energy when the data is written becomes smaller, the length of the period during which the low-resistance state is maintained becomes shorter. That is, as the write energy when the data is written becomes smaller, the holding period of the information in the memory cell MC decreases. It is therefore possible to change the data holding period in the memory device 10 by changing the write energy when the data is written according to the holding period required for the data to be stored.

When the storage controller 101 stores data for a normal holding period (e.g., about ten years), for example, the storage controller 101 causes the current having the first current value (e.g., 175 µA) to flow through the variable resistance element R to write the data in the memory cell MC. Further, when the storage controller 101 stores the data for a period shorter than the normal holding period, the storage controller 101 allows the current to flow through the variable resistance element R with the second current value, which is smaller than the first current value, to write the data in the memory cell MC. Further, when the storage controller 101 stores the data for a period shorter than the period stated above, the storage controller 101 causes the current having the third current value that is smaller than the second current value to flow through the variable resistance element R to write the data in the memory cell MC. While the example in which the storage controller 101 separately uses the three types of write energies depending on the difference in the holding period has been described here, the storage controller 101 may naturally control the write energy more finely. Further, the storage controller 101 may separately use two types of write energies depending on the difference in the holding period. Further, when the target to be stored in the memory device 10 is only the data which is required to be held for a period shorter than normal, the data may be stored using only a write energy smaller than the write energy that is used to store the data in the normal holding period.

While the storage controller 101 changes the magnitude of the current when data is written according to the holding period required for the data to be stored in this embodiment, besides the magnitude of the current, time during which current flows through the variable resistance element R when data is written may be changed.

Referring back to FIG. 2, each component of the memory device 10 will be continuously described.

The encryption processing unit 102 performs encryption processing and decryption processing. The encryption processing unit 102 encrypts or decrypts, for example, various kinds of data using the key information stored in the ReRAM 100. Further, the encryption processing unit 102 encrypts or decrypts, for example, the authentication information stored in the ReRAM 100 according to a predetermined rule. As stated above, the encryption processing unit 102 performs predetermined data processing on the security information stored in the ReRAM 100 or the security information to be stored in the ReRAM 100.

The CPU 103 controls each component of the memory device 10 by executing the program. Further, the volatile memory 104 is, for example, a Static Random Access Memory (SRAM) and is used for a work region or the like of the CPU 103.

Figure 6:
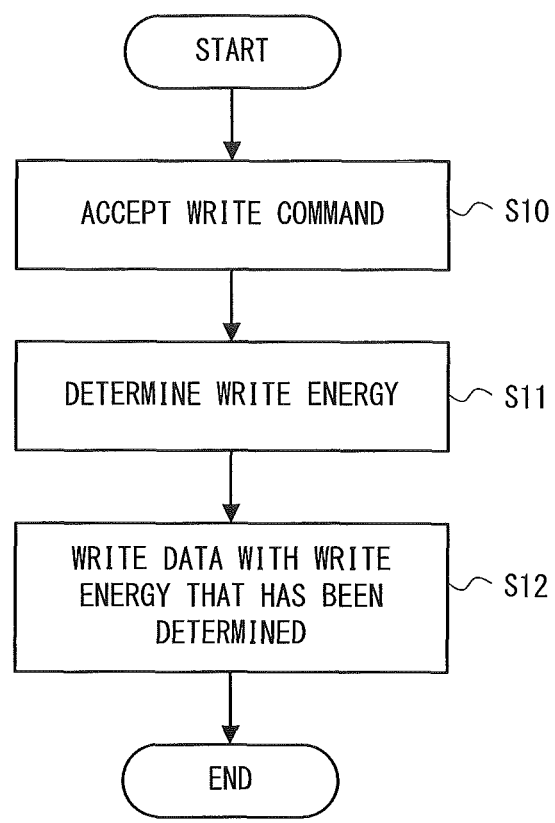
FIG. 6 is a flowchart showing one example of a write operation in a storage controller according to the first embodiment.

Next, a flow of the write operation according to this embodiment will be described. FIG. 6 is a flowchart showing one example of the write operation in the storage controller 101.

In Step 10 (S10), the storage controller 101 accepts a data write command. The storage controller 101 accepts, for example, the write command issued from the CPU 103. The storage controller 101 may accept the write command issued from a Direct Memory Access (DMA) controller (not shown) or the like, not from the CPU 103.

In Step 11 (S11), the storage controller 101 determines the write energy in accordance with the holding period required for the data to be stored. Specifically, the storage controller 101 determines at least the current value when data is written according to the holding period that has been requested.

In Step 12 (S12), the storage controller 101 writes data to be stored into the ReRAM 100 with the write energy determined in Step 11.

As described above, according to the memory device 10 in this embodiment, it is possible to automatically erase the data after storing the data according to the holding period required for the data to be stored. Since the memory device 10 has a configuration in which it stores data in the ReRAM. 100, it is possible to suppress the power consumption. Therefore, while a refresh power is needed to maintain the storage when the memory device that can erase the data after the elapse of the finite period of time is formed using a Dynamic Random Access Memory (DRAM), the storage can be maintained for a desired period of time without consuming much power in the memory device 10 according to this embodiment.

<Modified Example of First Embodiment>

While the storage controller 101 of the memory device 10 described in the above embodiment has changed the write energy when the data is written according to the data holding period, the storage controller 101 may use another storing condition as the storing condition according to the holding period required for the data to be stored. The storing condition according to the holding period required for the data to be stored may be, for example, a degree of interference of the storage for the data stored in the ReRAM 100. That is, the storage controller 101 may perform data storage control using the interference of the storage due to a so-called read disturb.

When the operation of reading out the data from the memory cell MC is repeated, the resistance value of the variable resistance element R in the memory cell in which the data is stored is changed. Normally, the reading conditions are adjusted so that this change becomes sufficiently small. However, when the reading conditions are not appropriate, for example, if the data is read out under a condition in which the voltage of the PL in FIG. 3 is higher than a predetermined value, the resistance value is changed. In this case, it can be understood that the reading operation has caused a soft write phenomenon (read disturb). Therefore, after the data has been written in one memory cell MC, the reading operation from the memory cell MC is repeated under a condition in which the voltage of the PL is intentionally increased, whereby the resistance value increases compared to the resistance value that is set when the data is written. Therefore, when the reading operation from the memory cell MC is repeated under a condition in which the voltage of the PL is intentionally increased, the period during which the low-resistance state is maintained becomes shorter than that in the case in which this operation is not performed. That is, it is possible to reduce the holding period of the storage in the memory cell MC as the intensity of the interference of the storage due to the read disturb increases.

The storage controller 101 may achieve the storage of the data for the holding period required for the data to be stored by using this phenomenon. That is, the storage controller 101 may repeat the reading operation from the memory cell MC in which the data has been stored under a condition in which the voltage of the PL is intentionally increased according to the holding period. More specifically, the storage controller 101 repeats, for example, the reading operation from the memory cell MC under a condition in which the voltage of the PL is intentionally increased the number of times corresponding to the holding period and interrupts the storage. The storage controller 101 increases the number of times of the reading operation from the memory cell MC as the holding period becomes shorter.

Figure 7:
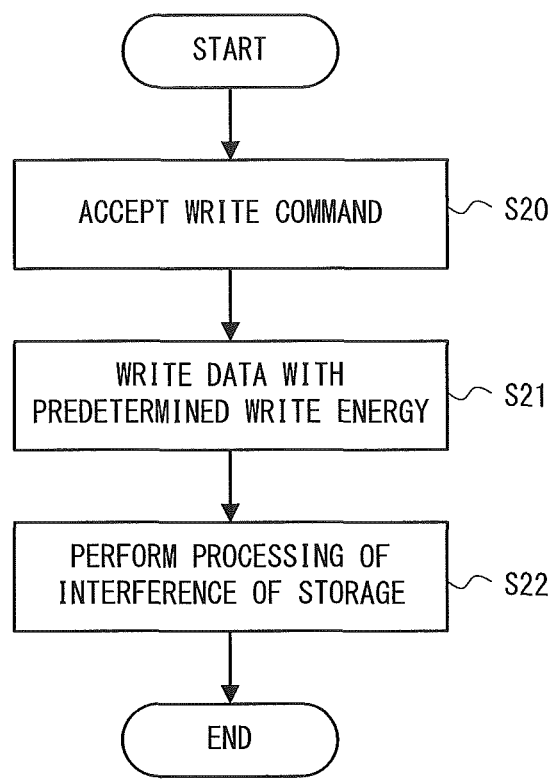
FIG. 7 is a flowchart showing one example of control in a storage controller according to a modified example of the first embodiment.

Next, a flow of the write operation of the memory device 10 according to this modified example will be described. FIG. 7 is a flowchart showing one example of control in the storage controller 101 according to the modified example.

In Step 20 (S20), similar to Step 10, the storage controller 101 accepts the data write command.

In Step 21 (S21), the storage controller 101 writes the data to be stored in the ReRAM 100 with a predetermined write energy. Specifically, the storage controller 101 performs control to allow the current having a predetermined current value to flow through the variable resistance element R for a predetermined period of time.

In Step 22 (S22), the storage controller 101 performs processing of the interference of the storage. That is, the storage controller 101 repeats the reading operation from the memory cell MC in which the data is stored under a condition in which the voltage of the PL is intentionally increased according to the holding period required for the data to be stored.

In the memory device 10 according to the modified example as well, the data can be stored for a finite period of time using the ReRAM 100. It is therefore possible to suppress power consumption when data is stored.

As stated above, the storage controller 101 may perform control to cause the ReRAM 100 to store the data under the storing condition according to the holding period required for the data to be stored and may not necessarily perform control by adjusting the write energy. The storage controller 101 may adjust not only the write energy but also the degree of interference of the storage due to the read disturb described in the above modified example.

<Second Embodiment>

Figure 8:
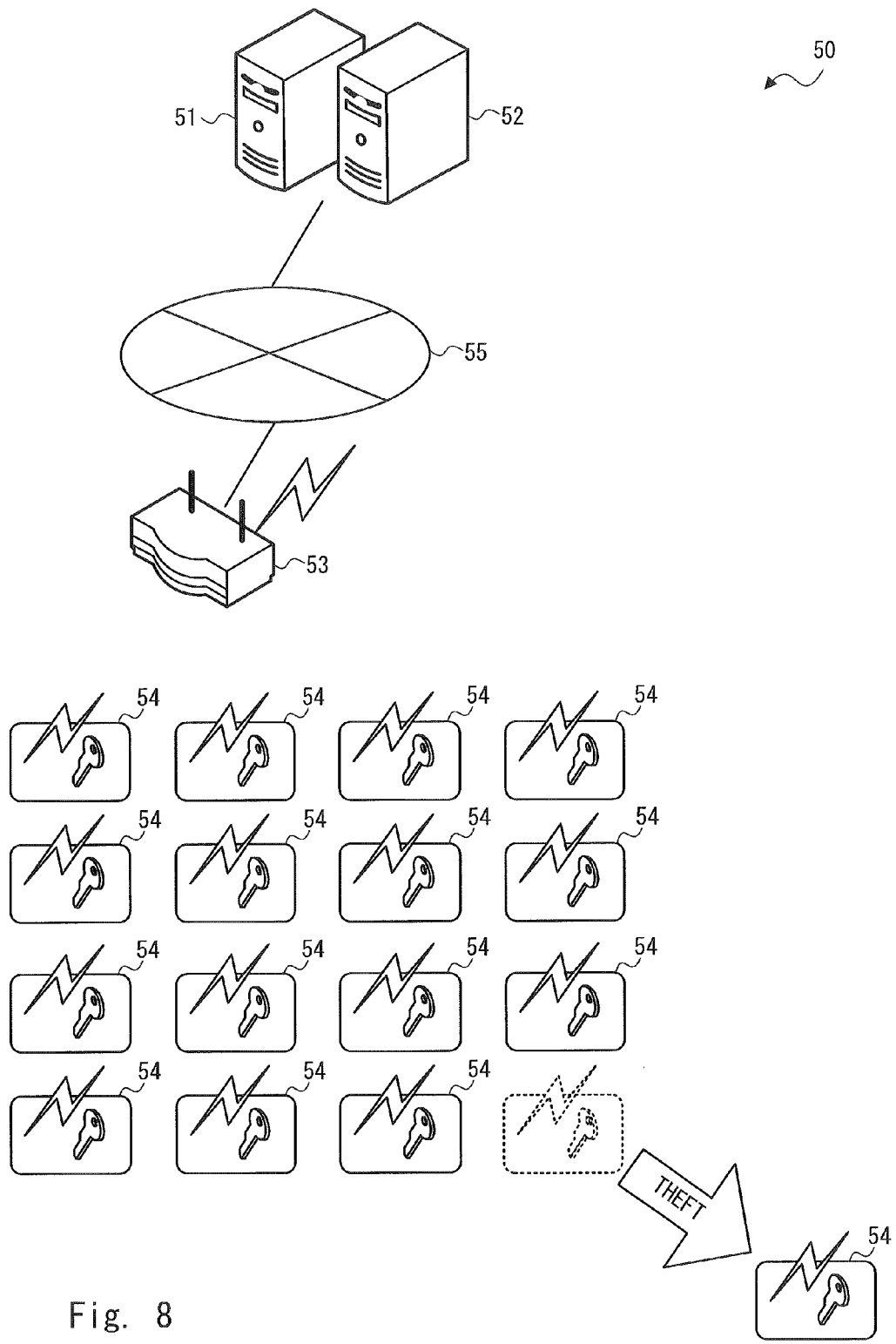
FIG. 8 is a schematic diagram showing a configuration of a security system according to a second embodiment.

Next, a second embodiment will be described. FIG. 8 is a schematic diagram showing a configuration of a security system 50 according to a second embodiment. As shown in FIG. 8, the security system 50 includes a data management server 51, a key management server 52, a gateway 53, and a plurality of IC cards 54. The data management server 51, the key management server 52, and the gateway 53 are connected to a network 55 such as the Internet and can communicate with one another.

The data management server 51 is a server that manages various kinds of data and manages, for example, data such as entry-exit record of the user. The key management server 52 is a server that issues key information used for encryption processing. The key management server 52 generates key information according to a predetermined encryption rule using, for example, random numbers. The key management server 52 distributes the key information that has been generated to each of the IC cards 54 via the gateway 53.

The gateway 53 is a device that relays communications between the network 55 and the IC cards 54. The gateway 53 performs radio communications with each of the IC cards 54. The IC card 54 is a card that is used, for example, as an identification card such as an employee ID card and includes a memory device 11 that will be described later. The IC card 54 acquires the key information issued by the key management server 52 and stores the key information in the memory device 11. The IC card 54 encrypts or decrypts various kinds of information such as the authentication information using the key information that has been acquired. The aforementioned configuration of the security system 50 allows the authorized user who holds the IC card 54 in which the key information has been stored to use the system.

When one of the IC cards 54 has been stolen in the security system 50 as shown in FIG. 8, the key information in the IC card 54 should be preferably erased in terms of the security.

Figure 9:
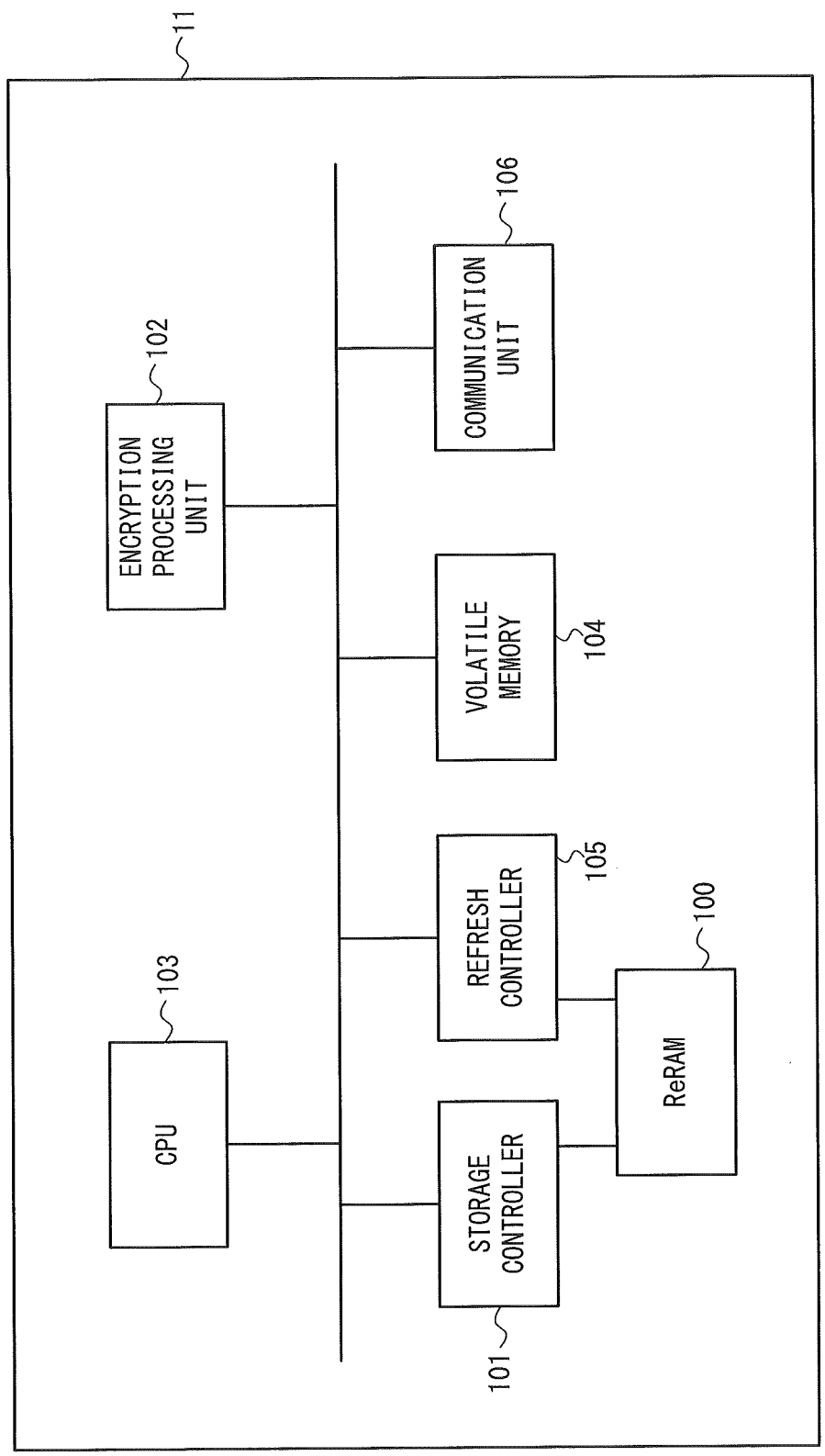
FIG. 9 is a block diagram showing a configuration of a memory device according to the second embodiment.

FIG. 9 is a block diagram showing a configuration of the memory device 11 according to the second embodiment. As shown in FIG. 9, the memory device 11 according to this embodiment is different from the memory device 10 in that a refresh controller 105 and a communication unit 106 are added to the memory device 11 according to this embodiment. In the following description, the characteristics of the memory device 11 different from those of the memory device 10 will be described.

The refresh controller 105 performs control to perform the refresh operation. That is, the refresh controller 105 performs control to again write data that has been stored in the ReRAM 100 by the control by the storage controller 101. In the memory device 11, similar to the memory device 10, the time during which the data is stored can be set shorter than that of the general ReRAM 100. The memory device 11 performs the refresh operation of the data in which the storage time is limited, whereby it is possible to extend the storage time. In this embodiment, the refresh controller 105 determines whether to extend the storage time of the data according to a communication state by the communication unit 106, as will be described later.

The communication unit 106 communicates with other apparatuses. Specifically, the communication unit 106 includes, for example, a transmission/reception circuit (not shown) and an antenna and performs radio communications. The communication unit 106 performs radio communications with the gateway 53 and communicates with each server connected to the network 55.

Figure 10:
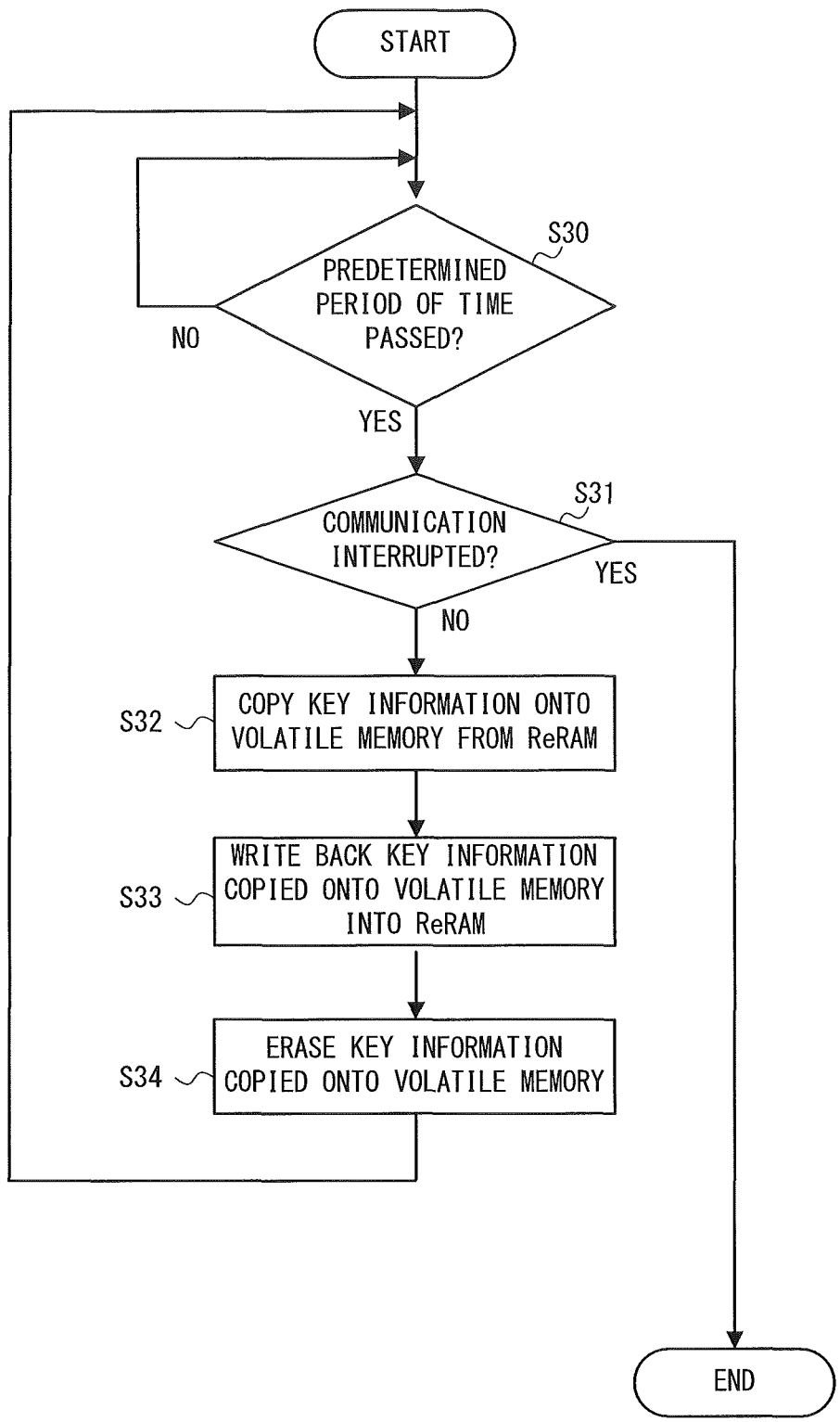
FIG. 10 is a flowchart showing one example of a flow of a refresh operation controlled by a refresh controller according to the second embodiment.

Hereinafter, details of the refresh operation will be described. FIG. 10 is a flowchart showing one example of a flow of the refresh operation controlled by the refresh controller 105. When the communication with another apparatus is available, the refresh controller 105 performs the refresh operation at predetermined time intervals and when the communication with the other apparatus is interrupted, the refresh controller 105 does not perform the refresh operation. In the following description, with reference to the flowchart shown in FIG. 10, a flow of processing of the refresh controller 105 will be described. The refresh controller 105 may include, for example, a register (not shown) that holds timing information indicating the timing when the refresh operation is performed and a timer (not shown) and achieve the refresh operation at predetermined time intervals.

In Step 30 (S30), the refresh controller 105 determines whether a predetermined period of time (e.g., 24 hours) has passed. The refresh controller 105 executes the refresh operation at predetermined time intervals to prevent the key information stored in the ReRAM 100 from being erased. The ReRAM 100 stores the key information under the storing condition corresponding to the holding period required for the key information by the storage control of the aforementioned storage controller 101. Therefore, when the refresh operation is not performed, the key information stored in the ReRAM 100 is erased after an elapse of a finite period of time. Therefore, the above predetermined period of time, which is an interval at which the refresh controller 105 performs the refresh operation, needs to be shorter than the time until the time when the key information stored in the ReRAM 100 is erased.

When it is determined that the predetermined period of time has passed in Step 30 (Yes in S30), the process goes to Step 31. On the other hand, when it is determined that the predetermined period of time has not passed in Step 30 (No in S30), the process goes back to Step 30 and the refresh controller 105 waits for the elapse of the predetermined period of time.

In Step 31 (S31), the refresh controller 105 checks whether the communication by the communication unit 106 is not interrupted. When the communication with the other apparatus is available (No in S31), the refresh controller 105 executes the following refresh operation. On the other hand, when the communication with the other apparatus has been interrupted (Yes in S31), the refresh controller 105 ends the processing without performing the refresh operation. The other apparatus in this embodiment is, for example, the gateway 53. When the IC card 54 is stolen and is moved out of the area in which the communication with the gateway 53 can be performed, for example, the communication unit 106 cannot perform radio communication with the gateway 53 and the communication is interrupted.

When the refresh controller 105 is able to communicate with the other apparatus, the refresh controller 105 performs control to perform the refresh operation in Steps 32 to 34.

In Step 32 (S32), the refresh controller 105 reads out the key information stored in the ReRAM 100 and performs control to copy the key information onto the volatile memory 104.

In Step 33 (S33), the refresh controller 105 performs control to write back the key information copied onto the volatile memory 104 in Step 32 into the ReRAM 100. At this time, the storage controller 101 again causes the ReRAM 100 to store the data in the storing condition according to the holding period required for the key information.

In Step 34 (S34), the refresh controller 105 performs control to erase the key information copied onto the volatile memory 104 in Step 32 from the volatile memory 104. After Step 34, the processing goes back to Step 30 again and the refresh controller 105 again waits for the elapse of the predetermined period of time.

As described above, in this embodiment, when the communication with the other apparatus is available, the refresh controller 105 reads out the data which will be subjected to the refresh operation to the volatile memory 104 at predetermined time intervals and writes back the data stored in the volatile memory 104 in the ReRAM 100. While the refresh controller 105 ends the processing when the communication with the other apparatus is interrupted in the example shown in FIG. 10, power supply to the volatile memory 104 may be interrupted. When the power supply to the volatile memory 104 is interrupted, the key information stored in the ReRAM 100 cannot be copied onto the volatile memory 104 in the refresh operation. When the communication is interrupted, the refresh controller 105 may perform control not to perform the refresh operation in this way.

In the memory device 11 according to the second embodiment, the refresh operation is performed on the data on the ReRAM 100 in which the storage time is limited to the finite period of time. Therefore, under a normal usage environment, the data can be stored almost permanently. Further, when an abnormal event such as theft occurs and the communication is interrupted, the storage cannot be maintained and the data on the ReRAM 100 is erased. It is therefore possible to assure the security. Since the processing of writing back the data in the refresh operation is performed only at predetermined time intervals (e.g., 24 hours), the power consumption can be suppressed.

While the refresh controller 105 determines whether to perform the refresh operation according to whether or not the communication with the other apparatus is available in this embodiment, as stated above, it is needless to say that the refresh controller 105 may be configured to execute the refresh operation regardless of whether or not the communication with the other apparatus is available. In this case, the memory device 11 does not necessarily include the communication unit 106.

<Third Embodiment>

Figure 11:
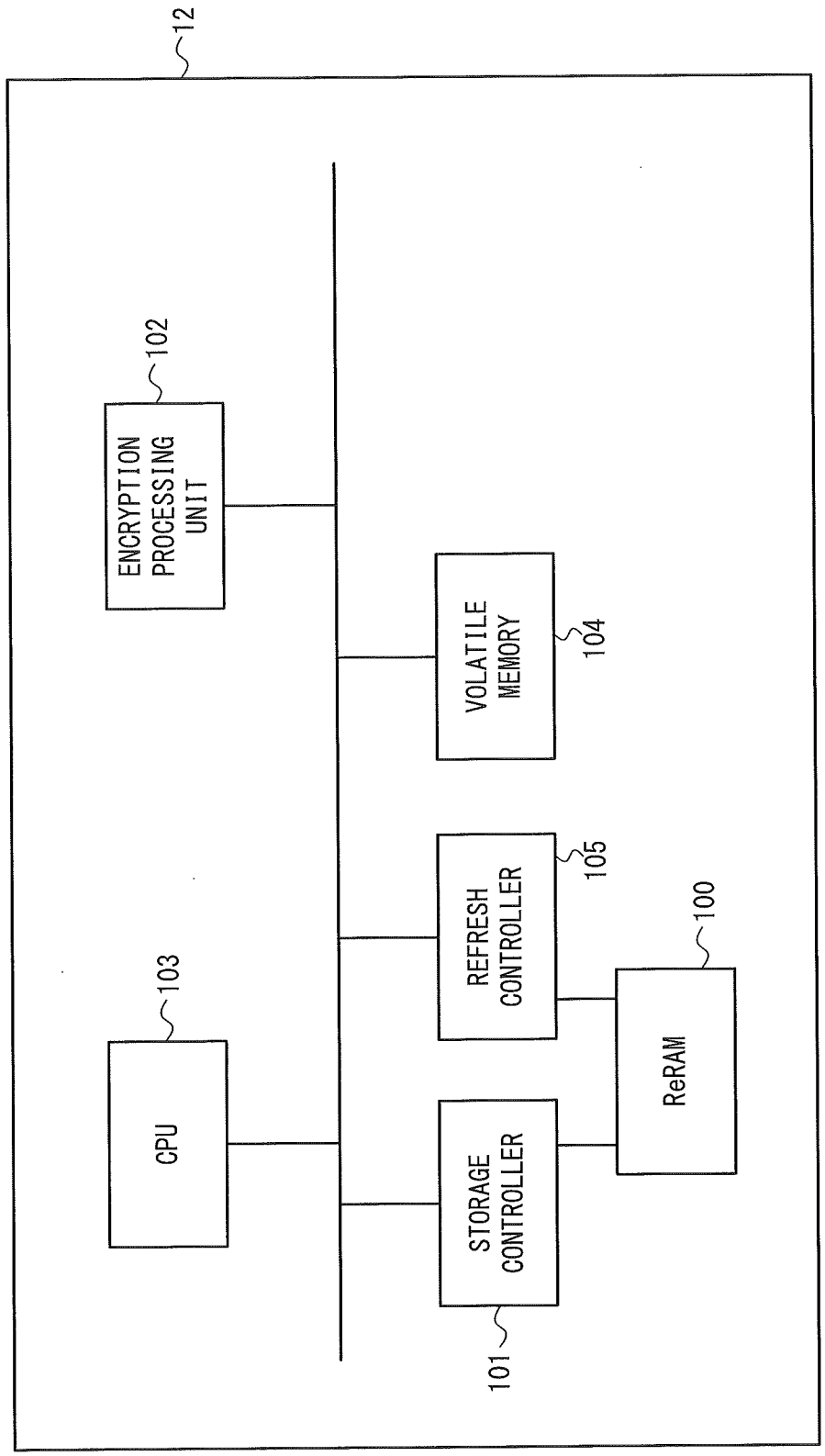
FIG. 11 is a block diagram showing a configuration of a memory device according to a third embodiment.

Next, a third embodiment will be described. In this embodiment, the storage controller 101 changes the storing condition for each memory area of the ReRAM 100. FIG. 11 is a block diagram showing a configuration of a memory device 12 according to the third embodiment. As shown in FIG. 11, the memory device 12 according to this embodiment has a configuration in which the communication unit 106 is removed from the memory device 11 according to the second embodiment. Therefore, the description that overlaps with the one given in the aforementioned embodiments will be omitted.

Figure 12:
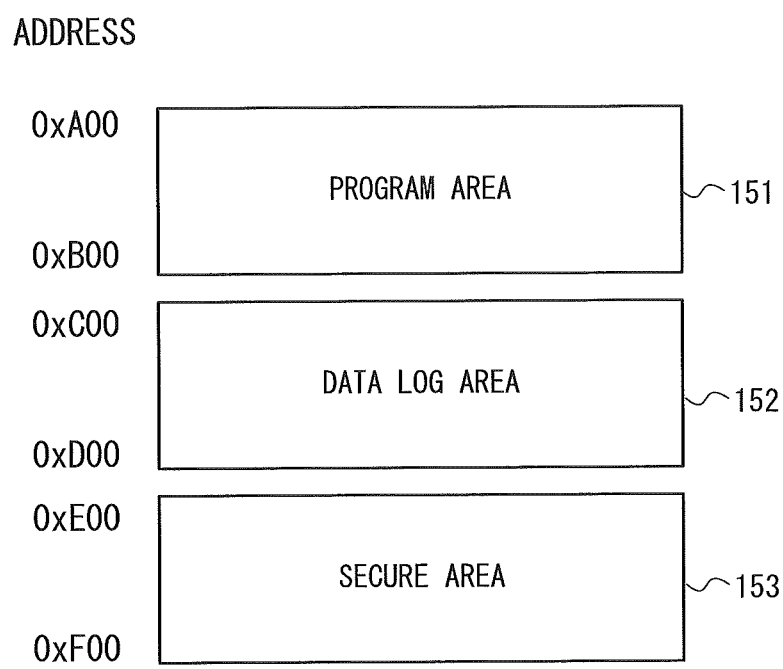
FIG. 12 is a schematic diagram showing one example of a memory area of an ReRAM.

In this embodiment, the ReRAM 100 includes, as shown in FIG. 12, a plurality of memory areas. In the example shown in FIG. 12, the ReRAM 100 includes a program area 151, a data log area 152, and a secure area 153.

The program area 151 is an area in which programs such as an operating system (OS), an application program and the like are stored. In general, the program is used for a long period of time once it is written in the storage destination except for a case in which, for example, the program is rewritten. Therefore, it is required that the information written in the program area be held for a long period of time.

The data log area 152 stores data such as program execution results. This data is generated every time the program is executed. The holding period required for the information written into the data log area 152 is shorter than the holding time required for the information to be written into the program area 151.

The secure area 153 is an area in which the authentication information to execute a specific application and the key information to encrypt or decrypt data are written. In order to ensure the security, the holding period of the information to be written into the secure area 153 is preferably finite. Therefore, in this embodiment, the holding period required for the data stored in the secure area 153 is the shortest among the holding periods required for the data stored in the three areas.

The storage controller 101 according to this embodiment applies storing conditions different from one another for each memory area of the ReRAM 100. That is, the storage controller 101 applies the storing condition according to the address space of the ReRAM. 100 in which the data is to be stored. Specifically, when the storage controller 101 stores data in the program area 151, the storage controller 101 performs control to store the data in the ReRAM 100 in the first storing condition. That is, when the program is stored in the ReRAM 100 or the program is re-written, the storage controller 101 uses the first storing condition. In a similar way, when the storage controller 101 stores data in the data log area 152, the storage controller 101 performs control to store the data in the ReRAM 100 in the second storing condition and when the storage controller 101 stores data in the secure area 153, the storage controller 101 performs control to store the data in the ReRAM 100 in the third storing condition.

The data holding period when the data is stored in the ReRAM 100 in the first storing condition is, for example, ten years. The data holding period when the data is stored in the ReRAM 100 in the second storing condition is shorter than the data holding period when the data is stored in the ReRAM 100 in the first storing condition and is, for example, several days. Further, the data holding period when the data is stored in the ReRAM. 100 in the third storing condition is shorter than the data holding period when the data is stored in the ReRAM 100 in the second storing condition. Specifically, the first storing condition may specify, for example, that the data should be written in the ReRAM 100 at the aforementioned first write energy. In a similar way, the second storing condition may specify that the data should be written in the ReRAM. 100 at the aforementioned second write energy. The third storing condition may specify that the data should be written in the ReRAM 100 at the aforementioned third write energy. The first storing condition, the second storing condition, and the third storing condition may not necessarily specify the difference in the write energy as stated above and may specify the difference in the degree of interference of the storage performed for the data as described in the modified example of the first embodiment.

Upon receiving the write command to the ReRAM 100 from the CPU 103, the storage controller 101 stores data in a storing condition in accordance with the region in which the data is to be written. The write command may be issued, for example, from a component such as the DMA controller which is different from the CPU 103. The storage controller 101 may be configured to store the storing condition in, for example, a register (not shown) included in the storage controller 101 or a memory (not shown) included in the storage controller 101 and select the storing condition according to the write command.

While the storing conditions correspond to the respective three areas in this embodiment, two or more storing conditions may be set for each of the areas. The secure area may further be divided into two areas and storing conditions different from each other may be set for the respective divided areas.

Next, the refresh controller 105 according to this embodiment will be described. When the data is stored in the first storing condition, data can be definitely held for a long period of time. Therefore, there is no need to perform the refresh operation. On the other hand, when the data is stored in the second storing condition or the third storing condition, the holding period may be extended by the refresh operation as required. When the period during which the data stored in the third storing condition is held in the ReRAM 100 is about 30 minutes, the key information stored in the secure area is erased 30 minutes later. Therefore, when the user performs an operation to extend the validity period of the key information, the refresh controller 105 again performs the refresh operation to perform storage processing in the third storing condition before the key information is erased based on the instruction from the CPU or the like, whereby it is possible to extend the period during which the key information is held in the ReRAM 100.

Further, when the required holding period is changed to become longer or shorter than the original holding period, the refresh controller 105 may execute the refresh operation in the storing condition according to the holding period after the change. For example, when the holding period required for the key information that has been originally set to 30 minutes is then changed so that the data can be held permanently, the refresh controller 105 may execute the refresh operation in the first storing condition.

Figure 13:
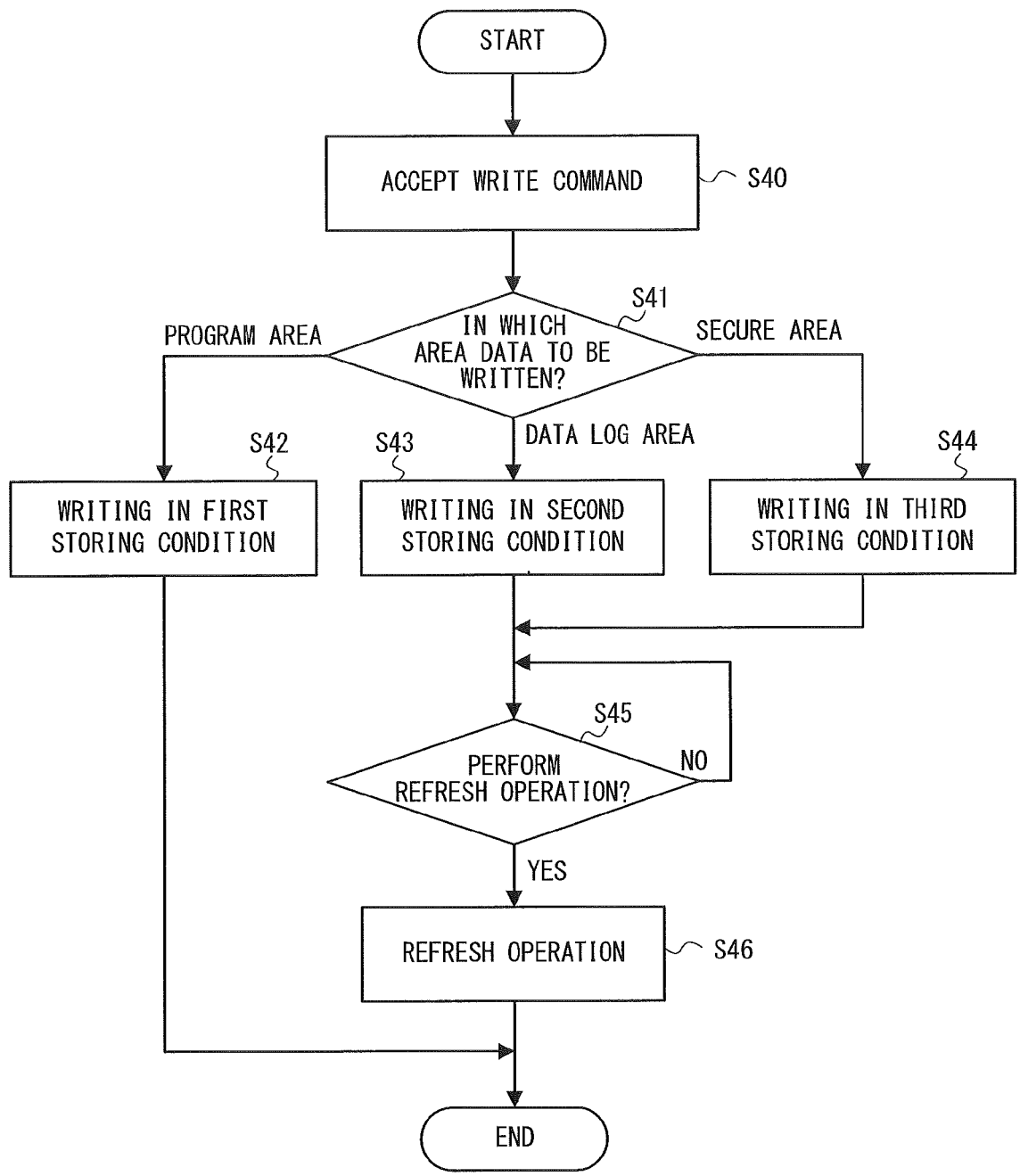
FIG. 13 is a flowchart showing one example of an operation of the memory device according to the third embodiment.

In the following description, an operation of the memory device 12 according to this embodiment will be described. FIG. 13 is a flowchart showing one example of the operation of the memory device 12 according to the third embodiment. In the following description, with reference to FIG. 13, an example of the operation of the memory device 12 will be described.

In Step 40 (S40), the storage controller 101 accepts the data write command. In Step 41 (S41), the storage controller 101 determines the memory area in which the data is to be written by the write command accepted in Step 40. When the data is to be written in the program area, the processing goes to Step 42. When the data is to be written in the data log area, the processing goes to Step 43. When the data is to be written in the secure area, the processing goes to Step 44.

In Step 42 (S42), the storage controller 101 performs control to store the data in the ReRAM 100 in the first storing condition. After the operation of Step 42 is completed, the processing ends. In Step 43 (S43), the storage controller 101 performs control to store the data in the ReRAM 100 in the second storing condition. Further, in Step 44 (S44), the storage controller 101 performs control to store the data in the ReRAM 100 in the third storing condition. After Step 43 is completed, the processing goes to Step 45. After Step 44 is completed, the processing also goes to Step 45.

In Step 45 (S45), the refresh controller 105 determines whether to perform the refresh operation. The refresh controller 105 waits until the conditions for executing the refresh operation are satisfied (No in S45), and when the conditions for executing the refresh operation are satisfied (Yes in S45), the refresh operation is executed in Step 46 (S46). Upon receiving an instruction to extend the holding period of the data stored in the data log area or the secure area, for example, the refresh controller 105 executes the refresh operation.

According to the memory device 12 in this embodiment, the storing condition is changed depending on the area in which the data is stored. It is therefore possible to achieve storage in an appropriate holding period that complies with the character of the data to be stored. Further, when the storage controller 101 writes data by changing the write energy for each memory area, the write energy in the data log area is smaller than the write energy in the program area. It is therefore possible to suppress power consumption in the storage processing in the data log area in which frequent rewriting is expected to occur.

The memory device 12 may further determine whether to execute the refresh operation according to the communication state as in the memory device 11 shown in the second embodiment. Further, while the configuration in which the refresh controller 105 is included has been described in this embodiment, a memory device that does not include the refresh controller 105 and applies the storing conditions different from one another for each memory area of the ReRAM 100 may be configured. Further, besides the storage controller 101 according to this embodiment, the storage controller 101 according to the other embodiments and the modified example stated above may also determine the storing condition to be applied based on the area in which the data is stored. However, the storage controller 101 according to the first embodiment, the modified example of the first embodiment, and the second embodiment may not necessarily determine the storing condition to be applied based on the area in which the data is to be stored. The storage controller 101 may accept, for example, information indicating the holding period required for the data to be stored and determine the storing condition to be applied according to the information that has been accepted. Further, the storage controller 101 may accept the instruction indicating the storing condition to be applied.

<Fourth Embodiment>

Figure 14:
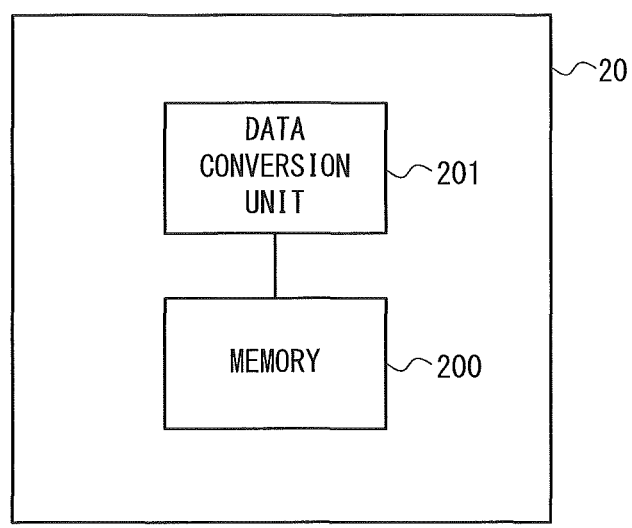
FIG. 14 is a block diagram for describing an outline of a memory device according to a fourth embodiment.

Next, a fourth embodiment will be described. Before describing details of the fourth embodiment, an outline of the fourth embodiment will be described. FIG. 14 is a block diagram for describing the outline of a memory device 20 according to the fourth embodiment. As shown in FIG. 14, the memory device 20 includes a memory 200 and a data conversion unit 201. The memory device 20 is constituted, for example, as a microcomputer.

The memory 200 is a memory that loses the stored content after a finite period of time elapses. That is, when the finite period of time elapses in the memory 200 without any process for maintaining the storage, the stored content is lost. That is, even when the processing of erasing the data stored in the memory 200 is not performed, the data stored in the memory 200 is automatically erased after the elapse of the finite period of time. The memory 200 may be, for example, an ReRAM or a DRAM. In the ReRAM, for example, by adjusting the storing condition, the data that has been stored is erased after the elapse of the finite period of time, as stated above. Further, in the DRAM, the data that has been stored is erased after the elapse of the finite period of time unless the refresh operation is performed at predetermined time intervals. The memory 200 is not limited to be the ReRAM or the DRAM as long as it is a memory that loses the stored content after a finite period of time elapses.

The data conversion unit 201 converts the data of a first bit number into data of a second bit number larger than the first bit number according to the value of the data of the first bit number. The data conversion unit 201 performs conversion according to a predetermined conversion rule in which the value of the data of the first bit number before the conversion and the type of the bit string of the second bit number after the conversion correspond one to one with each other. Therefore, according to the conversion by the data conversion unit 201, n-bit data is converted into redundant m (n<m)-bit data.

The memory 200 stores data converted by the data conversion unit 201. When the data to be stored is n-bit data, for example, this data is converted into m-bit data by conversion performed by the data conversion unit 201. Therefore, the memory 200 stores data that can be originally stored in n memory cells in m memory cells.

It is not easy to accurately control the time required for the erasure of the data to be a desired time due to the individual difference among the memory cells in the memory 200. In the meanwhile, even when there is a variation in the performance of each of the memory cells, the performance of the group formed of the plurality of memory cells is a statistical performance and is stable. Now, a case in which the storage is controlled so that the stored content is erased after the elapse of time x and data is stored in each of the k memory cells of the memory 200 will be described as an example. In this case, in some memory cells among the k memory cells, the stored content is erased after the elapse of the time x. In the other memory cells, the stored content is erased before the time x or after the time x. It is not easy to configure the memory device that is able to erase the stored content at exactly the time x. However, for the entire set of k memory cells, the timing when the data is erased in the memory cell in which the stored content is erased at the earliest timing is stable. That is, no matter which memory cells are extracted as the k memory cells that compose the group, the performance of the holding time of the group is stable. The performance tends to be stable as k becomes larger.

Performing control to erase the data in any one of the k memory cells in the holding time x is easier than performing control to erase the data in one memory cell in the holding time x. The memory device 20 according to this embodiment is configured to store the data based on this statistical property.

The data conversion unit 201 converts the data to be stored into the redundant data as described above. The memory 200 stores the data converted by the data conversion unit 201. In this way, in the memory device 20, the number of memory cells to be used for the storage is increased so that the statistical property can be used. Since data conversion is performed according to the conversion rule in which the value of n-bit data before the conversion and the type of the bit string of m bits after the conversion correspond one to one with each other, when data is erased in one of the m memory cells in which m-bit data after the conversion is stored, the m-bit data does no longer belong to the original type and the m-bit data cannot be re-converted into the data before the conversion any more. That is, if the information stored in any one of the m bits is lost, an effect similar to that of the case in which the original n-bit data is erased is obtained.

Therefore, in the memory device 20 according to this embodiment, even when the time required for the stored content to be erased varies among the memory cells, it is possible to suppress the variation of the time required for the data to be stored to be erased.

Figure 15:
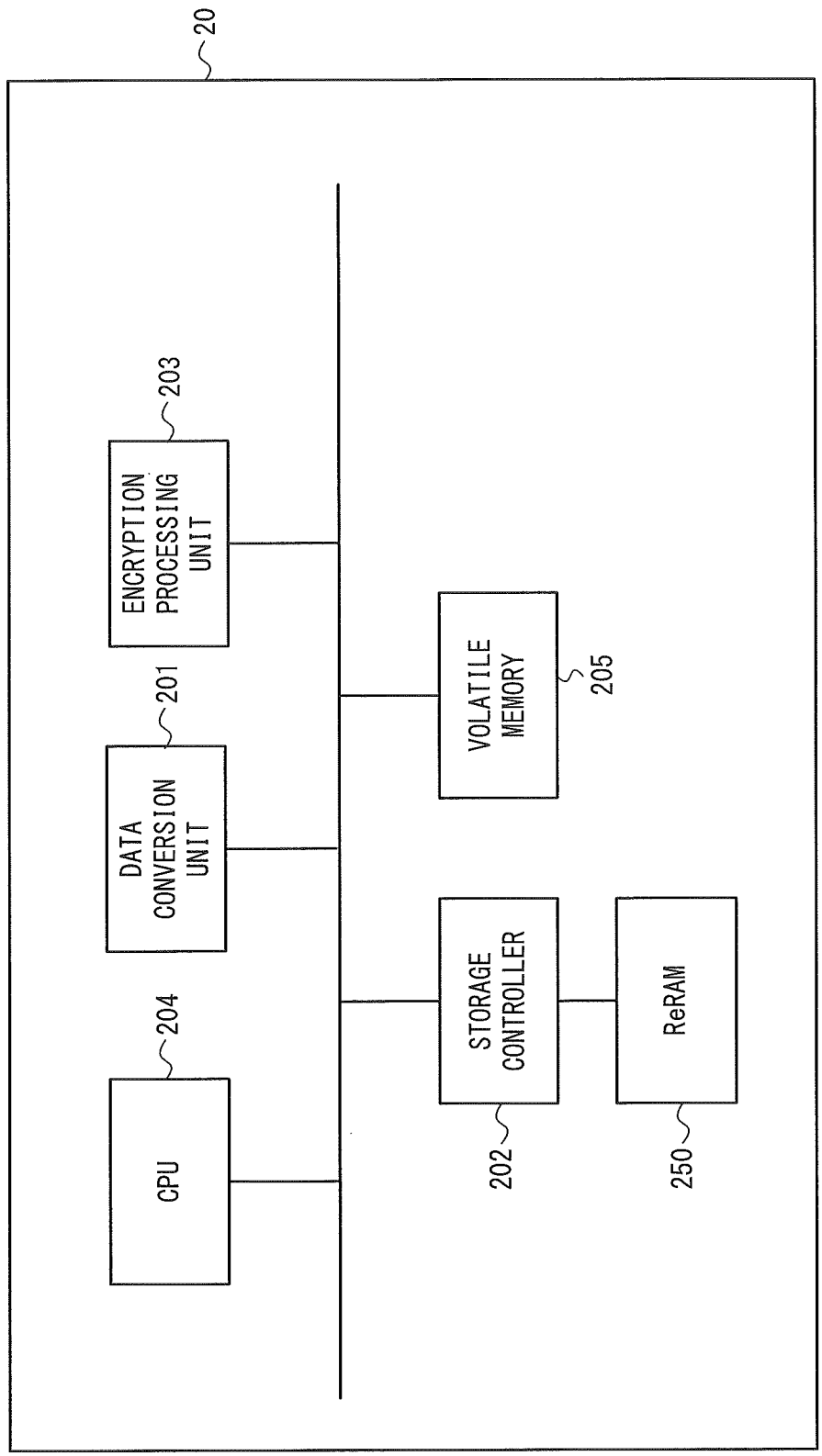
FIG. 15 is a block diagram showing a configuration of the memory device according to the fourth embodiment.

Hereinafter, the details of the fourth embodiment will be described. FIG. 15 is a block diagram showing a configuration of the memory device 20 according to the fourth embodiment. In this description, the memory 200 is assumed to be the ReRAM. A configuration example of a case in which the memory 200 is a DRAM will be described later as a fifth embodiment. As shown in FIG. 15, the memory device 20 includes a data conversion unit 201, a storage controller 202, an ReRAM 250 as the memory 200, an encryption processing unit 203, a CPU 204, and a volatile memory 205 and is constituted, for example, as a microcomputer. The memory device 20 stores, for example, security information such as key information or authentication information as the data to be stored.

Since the ReRAM. 250, the encryption processing unit 203, the CPU 204, and the volatile memory 205 are similar to the ReRAM 100, the encryption processing unit 102, the CPU 103, and the volatile memory 104 stated above, descriptions thereof will be omitted. In the following description, the data conversion unit 201 and the storage controller 202 will be described.

As stated above, the data conversion unit 201 converts the data of the first bit number into data of the second bit number according to the value of the data of the first bit number. At this time, the data conversion unit 201 performs conversion according to the conversion rule in which the value of the data of the first bit number before the conversion and the type of the bit string of the second bit number after the conversion correspond one to one with each other. Specifically, the data conversion unit 201 performs, for example, the following conversion.

Figure 16:
FIG. 16 is a schematic diagram for describing one example of conversion by a data conversion unit according to the fourth embodiment.

FIG. 16 is a schematic diagram for describing one example of the conversion by the data conversion unit 201. The example shown in FIG. 16 shows a state in which the data conversion unit 201 converts "1001", which is 4-bit security information to be stored, into 256-bit data. The data conversion unit 201 converts each bit of the data to be stored into 64-bit data. More specifically, when the data conversion unit 201 converts one-bit value into a bit string of 64 bits, if the value before the conversion is 0, the data conversion unit 201 converts the one-bit value into a bit string of 64-bit random numbers in which the total number of the bit string becomes an even number. In a similar way, when the value before the conversion is 1, the data conversion unit 201 converts the one-bit value into a bit string of 64-bit random numbers in which the total number of the bit string becomes an odd number. The data conversion unit 201 may convert, when the value before the conversion is 0, the one-bit value into a bit string in which the total number of the bit string becomes an odd number and may convert, when the value before the conversion is 1, the one-bit value into a bit string in which the total number of the bit string becomes an even number. As described above, the data conversion unit 201 may convert one-bit value into a plurality of bits so that one-bit value before the conversion and the parity of the total number of values of the plurality of respective bits after the conversion correspond one to one with each other.

Further, when the data that has been converted and stored in the ReRAM 250 is read out, the data conversion unit 201 performs conversion opposite to the conversion that is performed when the data is stored, and restores the converted data. In the example shown in FIG. 16, the data conversion unit 201 restores, when the total number of the 64-bit data string is an even number, the value to 0, which is a one-bit value and restores, when the total number of the 64-bit data string is an odd number, the value to 1, which is a one-bit value. Therefore, if the value stored in the ReRAM 250 cannot be held in any one of the bits of data after the conversion represented by the redundant bit string, it is not impossible to correctly restore the data. The data is then destroyed.

The data conversion unit 201 may store the data that has been restored as a result of the reverse conversion from the conversion performed when the data is stored in the volatile memory 205. By storing the restored data in the volatile memory 205 when using the data that has been stored, the data conversion unit 201 does not need to restore the data every time the data is used, whereby it is possible to suppress the load. Further, storing the data in the volatile memory 205 is more advantageous than storing the data that has been restored in the non-volatile memory to prevent the leakage of the data to be stored due to the theft or the like of the memory device 20.

The storage controller 202 controls storage of the data converted by the data conversion unit 201 in the ReRAM 250. The storage controller 202 performs control to store, similar to the aforementioned storage controller 101, the data to be stored in the ReRAM 250 in the storing condition according to the holding period required for the data to be stored. Specifically, the storage controller 202 performs control, for example, to write the data converted by the data conversion unit 201 in the ReRAM 250 at the current having the magnitude corresponding to the holding period required for the data to be stored. The storage controller 202 may perform storage control using the interference of the storage due to the read disturb, as shown in the modified example of the first embodiment. That is, after the data to be stored is stored in the ReRAM 250, the storage controller 202 may control the memory cell that stores this data so that the reading operation is repeated under a condition in which the voltage of the PL is intentionally increased according to the holding period required for the data.

Figure 17:
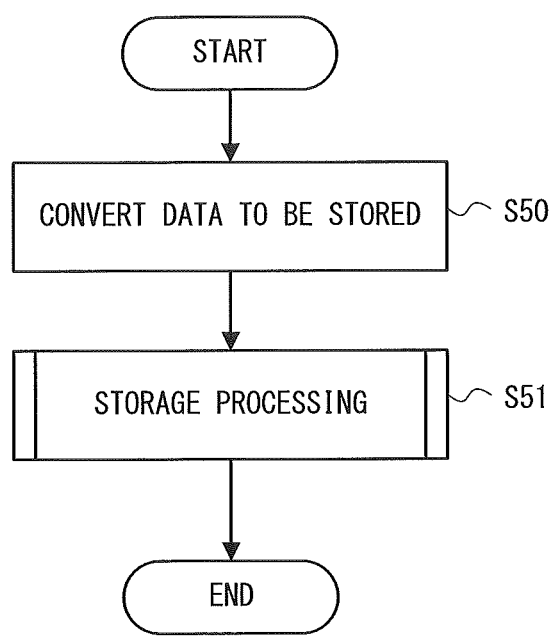
FIG. 17 is a flowchart showing one example of storage processing of a memory device according to the fourth embodiment.

Next, a flow of the storage processing according to this embodiment will be described. FIG. 17 is a flowchart showing one example of the storage processing of the memory device 20.

In Step 50 (S50), the data conversion unit 201 converts the data to be stored. Next, in Step 51 (S51), the data converted in Step 50 is subjected to the storage processing by the storage controller 202. The specific processing in Step 51 includes processing of S10 to S12 shown in FIG. 6 or processing of S20 to S22 shown in FIG. 7. The configuration according to this embodiment may be combined with each of the embodiments stated above. That is, the aforementioned refresh controller 105 may be further provided in this embodiment, for example, and processing of S40 to S46 shown in FIG. 13 may be performed as the processing in Step 51. Further, control of the refresh operation shown in FIG. 10 may also be performed. Further, the data conversion in Step 50 may be performed only on the data to be written in the aforementioned secure area 153.

The memory device 20 according to the fourth embodiment has been described above. Even when the data is stored in the respective memory cells of the ReRAM 250 under the same storing condition, the resistance value of the variable resistance element of each memory cell varies due to the individual difference among the memory cells. Therefore, it is not easy to accurately control the timing when the data is erased to be a desired time. However, in the memory device 20, the data is converted into the redundant data by the data conversion unit 201 and the redundant data is stored in the ReRAM 250. Therefore, the statistical property can be used as stated above, whereby it is possible to improve the accuracy of the timing when the data to be stored is erased. Therefore, when information obtained by converting the security information by the data conversion unit 201 is stored, in particular, a more secure management is performed.

<Fifth Embodiment>

Figure 18:
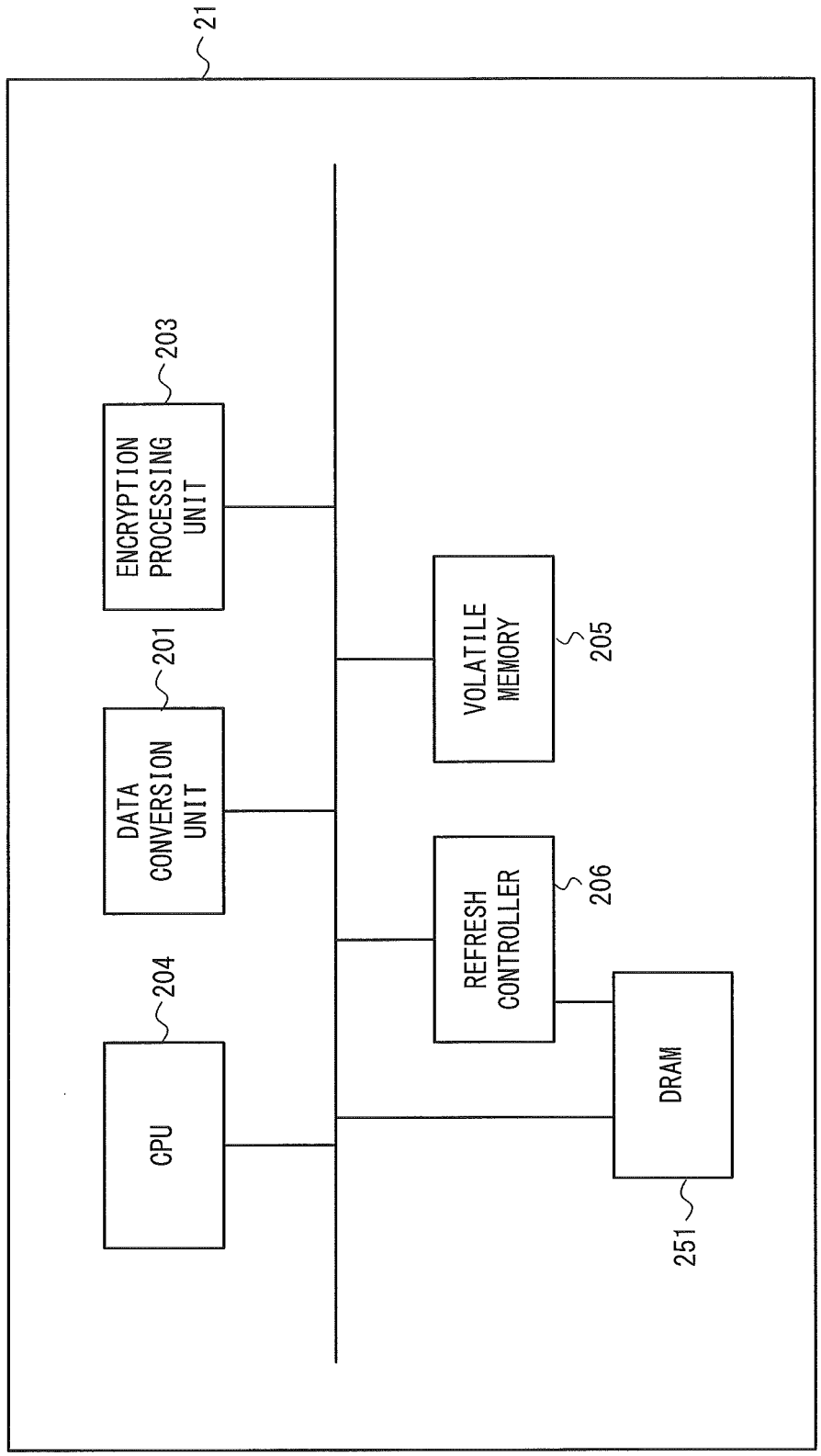
FIG. 18 is a block diagram showing a configuration of a memory device according to a fifth embodiment.

Next, a fifth embodiment will be described. A memory device 21 according to a fifth embodiment is different from the memory device 20 according to the fourth embodiment in that a DRAM 251 is used in place of the ReRAM 250 for the above memory 200. FIG. 18 is a block diagram showing a configuration of the memory device 21 according to the fifth embodiment. As shown in FIG. 18, the memory device 21 includes a data conversion unit 201, a DRAM 251, a refresh controller 206, an encryption processing unit 203, a CPU 204, and a volatile memory 205, and is formed, for example, as a microcomputer.

In the memory device 21, similar to the memory device 20, data to be stored is converted by the data conversion unit 201 and the converted data is stored. The data is stored in the DRAM 251 in this embodiment.

The refresh controller 206 controls the refresh operation of the DRAM 251. Specifically, the refresh controller 206 performs control to repeat the refresh operation of the data to be stored until the timing in accordance with the holding period required for the data to be stored. That is, while the refresh controller 206 charges a capacitor of each memory cell (not shown) in the DRAM 251 at predetermined time intervals, when the timing according to the holding period required for the data to be stored arrives, the following refresh operation is stopped. Therefore, the data stored in the DRAM 251 is erased after the refresh operation is stopped.

Figure 19:
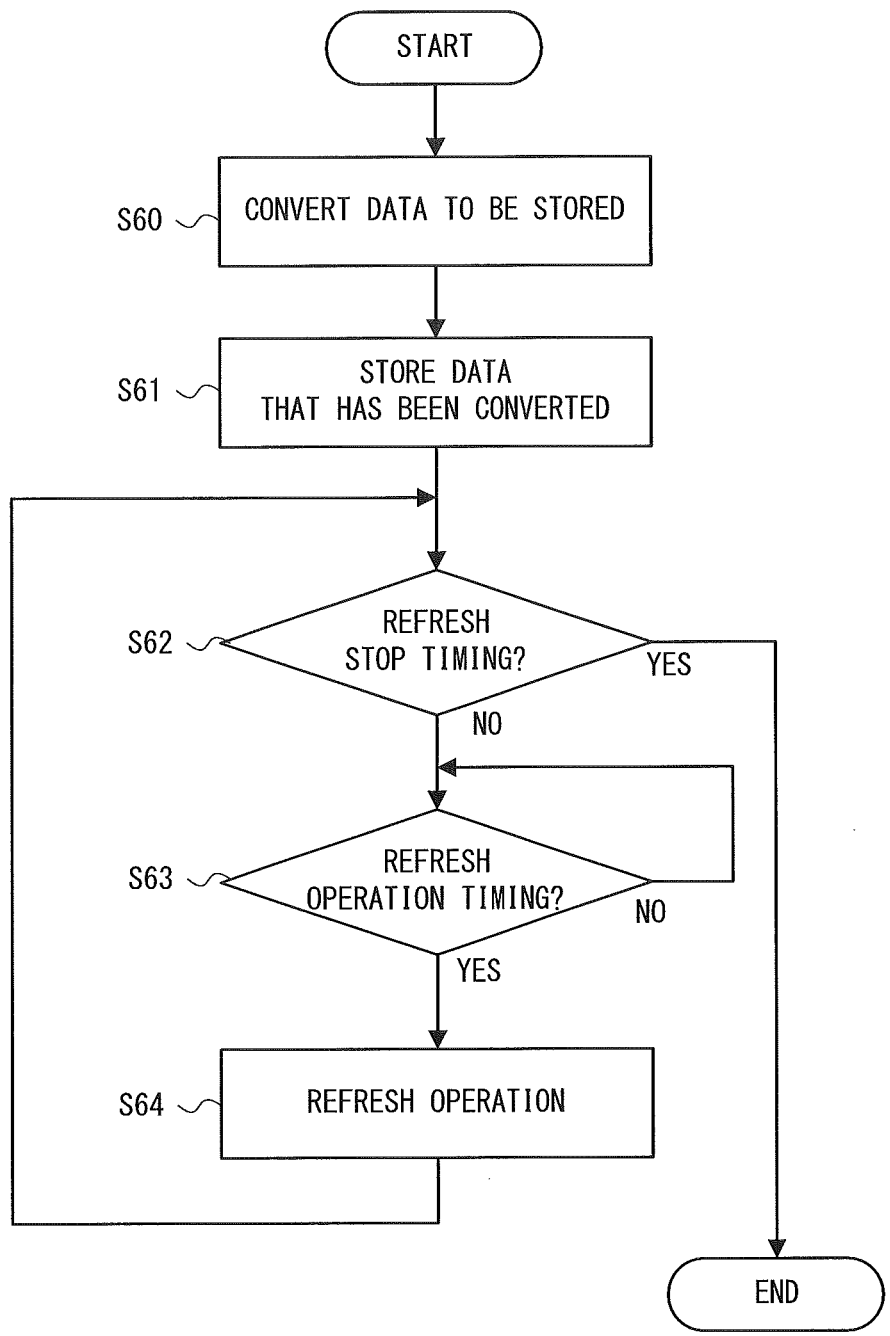
FIG. 19 is a flowchart showing one example of storage processing of the memory device according to the fifth embodiment.

FIG. 19 is a flowchart showing one example of processing for storing data in the memory device 21.

In Step 60 (S60), the data conversion unit 201 converts the data to be stored. Next, in Step 61 (S61), the DRAM 251 stores data converted in Step 60. Next, in Step 62 (S62), the refresh controller 206 checks whether the refresh stop timing has arrived. That is, the refresh controller 206 determines whether the timing according to the holding period required for the data to be stored has passed. When the refresh stop timing has passed, the processing is ended and when the refresh stop timing has not passed, the processing moves to Step S63 to continue the storage. When the refresh stop timing has arrived, the following refresh operation is not performed and the data stored in Step 61 is erased.

In Step 63 (S63), the refresh controller 206 determines whether the refresh operation timing has arrived. That is, the refresh controller 206 determines whether the predetermined period of time has passed after the previous refresh operation. When the refresh operation timing has not arrived, the refresh controller 206 waits for the arrival of the refresh timing. When the refresh timing has arrived, the processing goes to Step 64 (S64), where the refresh operation of the DRAM 251 is performed.

The memory device 21 according to the fifth embodiment has been described above. When the refresh operation is no longer performed, the data stored in the DRAM 251 is erased. Therefore, the security information stored in the memory device 21 becomes invalid, for example. However, the timing when the data is erased is not limited to the timing when the refresh operation is stopped. The timing when the data is erased depends on the performance of the capacitor of the memory cell that forms the DRAM 251. Therefore, it is not easy to accurately control the timing when the data is erased to a desired time. However, since the memory device 21 stores the redundant data that has been converted by the data conversion unit 201 in the DRAM 251, it is possible to use the statistical property and to improve the accuracy of the timing when the data to be stored is erased. Therefore, when information obtained by converting the security information by the data conversion unit 201 is stored, in particular, a more secure management is performed.

While the invention made by the present inventors has been specifically described based on the embodiments, it is needless to say that the present invention is not limited to the embodiments already stated above and various changes may be made on the embodiments without departing from the spirit of the present invention.

The first to fifth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:
1. A memory device comprising:
 a resistance random access memory; and
 a storage controller configured to perform control to store, in a storing condition according to a holding period required for data to be stored, the data in the resistance random access memory.

2. The memory device according to claim 1, wherein:
the storing condition specifies at least the magnitude of a current when the data is written in the resistance random access memory, and
the storage controller writes the data at a current having the magnitude according to the holding period.

3. The memory device according to claim 1, wherein:
the storing condition is a degree of interference of a storage performed for the data stored in the resistance random access memory, and
the storage controller repeats a reading operation from a memory cell in which the data is stored according to the holding period.

4. The memory device according to claim 1, further comprising a refresh controller configured to perform control to perform a refresh operation, the refresh operation being an operation for writing again data stored in the resistance random access memory by the control performed by the storage controller.

5. The memory device according to claim 4, further comprising a communication unit configured to perform communication with another apparatus,
wherein the refresh controller performs the refresh operation at predetermined time intervals when the communication with the other apparatus is available and does not perform the refresh operation when the communication with the other apparatus is interrupted.

6. The memory device according to claim 4, further comprising:
a communication unit configured to perform communication with another apparatus; and
a volatile memory,
wherein, when the communication with the other apparatus is available, the refresh controller reads out the data which will be subjected to the refresh operation to the volatile memory and writes the data that has been stored in the volatile memory back to the resistance random access memory at predetermined time intervals, and when the communication with the other apparatus is interrupted, the refresh controller interrupts power supply to the volatile memory.

7. The memory device according to claim 1, wherein:
the resistance random access memory comprises a plurality of memory areas, and
the storage controller applies storing conditions different from one another for each of the memory areas.

8. The memory device according to claim 1, wherein the data to be stored is key information or authentication information.

9. The memory device according to claim 1, wherein the storing condition comprises a degree of interference of a storage performed for the data stored in the resistance random access memory.

10. The memory device according to claim 1, wherein the storage controller repeats a reading operation from a memory cell in which the data is stored according to the holding period.

11. The memory device according to claim 1, further comprising:
a refresh controller which performs a refresh operation for writing again data stored in the resistance random access memory.

12. The memory device according to claim 11, further comprising:
a communication unit which performs communication with another apparatus, the refresh controller performing the refresh operation at predetermined time intervals when the communication with the other apparatus is available.

13. A storing method comprising:
storing, in a storing condition according to a holding period required for data to be stored, the data in a resistance random access memory.

14. The storing method according to claim 13, wherein:
the storing condition specifies at least the magnitude of a current when the data is written in the resistance random access memory, and
the data is written in the resistance random access memory at the current according to the holding period.

15. The storing method according to claim 13, wherein:
the storing condition is a degree of interference of a storage performed for the data stored in the resistance random access memory, and
after the data is written in the resistance random access memory, a reading operation from a memory cell in which the data is stored is repeated according to the holding period of the data.

16. A storage controller for a memory device including a resistance random access memory, the storage controller storing, in a storing condition according to a holding period required for data to be stored, the data in the resistance random access memory.

17. The storage controller according to claim 16, wherein the storing condition specifies at least the magnitude of a current when the data is written in the resistance random access memory, and
wherein the storage controller writes the data at a current having the magnitude according to the holding period.

18. The storage controller according to claim 16, wherein the storing condition is a degree of interference of a storage performed for the data stored in the resistance random access memory, and
wherein the storage controller repeats a reading operation from a memory cell in which the data is stored according to the holding period.

* * * * *